United States Patent
Nishiuchi et al.

(10) Patent No.: US 8,027,801 B2
(45) Date of Patent: Sep. 27, 2011

(54) MULTI DRIVE TEST SYSTEM FOR DATA STORAGE DEVICE

(75) Inventors: Shigeto Nishiuchi, Kanagawa (JP); Satoshi Takahashi, Kanagawa (JP); Masashi Tsuyama, Kanagawa (JP); Takahiro Nakagawa, Kanagawa (JP)

(73) Assignee: Hitachi Global Storage Technologies Netherlands B.V. (NL)

(*) Notice: Subject to any disclaimer, the term of this patent is extended or adjusted under 35 U.S.C. 154(b) by 669 days.

(21) Appl. No.: 11/513,788

(22) Filed: Aug. 30, 2006

(65) Prior Publication Data

US 2007/0061638 A1  Mar. 15, 2007

(30) Foreign Application Priority Data

Sep. 1, 2005 (JP) .................... 2005-252964

(51) Int. Cl.
- *G01R 31/28* (2006.01)
- *G01R 11/02* (2006.01)
- *G01L 1/00* (2006.01)
- *G01D 9/02* (2006.01)

(52) U.S. Cl. ......... 702/118; 702/117; 702/121; 702/125

(58) Field of Classification Search .................. 702/127, 702/130, 182–188; 248/346.06; 324/760; 714/723

See application file for complete search history.

(56) References Cited

U.S. PATENT DOCUMENTS

| | | | | |
|---|---|---|---|---|
| 5,666,497 A | * | 9/1997 | Milhaupt et al. | 710/305 |
| 5,713,006 A | * | 1/1998 | Shigeeda | 711/170 |
| 6,169,413 B1 | * | 1/2001 | Paek et al. | 324/760 |
| 6,389,560 B1 | | 5/2002 | Chew | |
| 6,865,506 B1 | * | 3/2005 | Escobar et al. | 702/130 |
| 7,232,101 B2 | * | 6/2007 | Wanek et al. | 248/346.06 |
| 7,243,043 B2 | * | 7/2007 | Shin | 702/182 |
| 7,356,744 B2 | * | 4/2008 | Korhonen | 714/723 |
| 2004/0230399 A1 | | 11/2004 | Shin | |

FOREIGN PATENT DOCUMENTS

| | | |
|---|---|---|
| JP | 60-201249 | 11/1985 |
| JP | 04-329378 | 4/1991 |
| JP | 04-048321 | 2/1992 |
| JP | 2004-329378 | 11/1992 |
| JP | 05-081047 | 2/1993 |
| JP | 05-081206 | 2/1993 |
| JP | 2005-081047 | 2/1993 |

(Continued)

*Primary Examiner* — Michael Nghiem
*Assistant Examiner* — Felix E Suarez
(74) *Attorney, Agent, or Firm* — Mahamedi Paradice Kreisman LLP; Christopher J. Brokaw

(57) ABSTRACT

Embodiments of the invention provide a data storage device test method and data storage device manufacture method which allow a tester to perform an operation test of plural data storage devices connected thereto in a shorter period of time. In one embodiment, an operation test of each of plural HDDs $8_1$-$8_4$ connected to a tester is performed by making plural HDDs $8_1$-$8_4$ execute commands received from the tester, wherein, during a waiting period when exchange stops between the tester and, for example, HDD $8_1$ of which operation test is being executed, the tester executes the operation test of another HDD. Such a waiting period occurs, for example, before HDD $8_1$ becomes ready to receive a command, before a data transfer is completed and before HDD $8_1$ becomes ready to receive the subsequent command. By using this waiting period, the tester issues a command to, for example, HDD $8_2$ if the HDD is ready to receive a command or transfers data to the HDD if data transfer is possible.

21 Claims, 5 Drawing Sheets

FOREIGN PATENT DOCUMENTS

| JP | 08-153057 | 11/1996 |
| JP | 10-064173 | 3/1998 |
| JP | 2000-215116 | 8/2000 |
| JP | 2004-342116 | 12/2004 |

* cited by examiner

MULTI DRIVE TEST SYSTEM FOR DATA STORAGE DEVICE

CROSS-REFERENCES TO RELATED APPLICATIONS

This application claims priority from Japanese Patent Application No. JP2005-252964, filed Sep. 1, 2005, the entire disclosure of which is incorporated herein by reference.

BACKGROUND OF THE INVENTION

The present invention relates to a data storage device test method to check if an assembled data storage device operates normally, and a data storage device manufacture method which has a test stage to check if an assembled data storage device operates normally.

Generally, after assembly, a hard disk device (HDD) undergoes various test stages such as servo write, a function test, burn-in and a final test before shipped. For mass production of HDDs, it is preferable to be able to test (inspect) a large number of assembled HDDs in a short period of time without occupying a large space. If testers are connected to HDDs on a one for one basis, it is not possible to reduce the occupied space since as many testers as HDDs are needed to test the HDDs at a time.

In order to reduce the occupied space, it is preferable to test many HDDs as quickly as possible by one tester. Accordingly, Patent Document 1 (Japanese Patent Laid-open No. 10-64173) discloses a burn-in test method in which many HDDs under test are connected to one host computer.

In the case of the test method described in Patent Document 1, one host computer is connected to twenty test computers each of which has three dual-channel IDE (Integrated Device Electronics) adapters attached thereto. Two HDDs under test are connected to each IDE adapter. The HDDs under test, which are connected to the IDE adapters, are accommodated in a high temperature burn-in chamber while the test computers are accommodated in a control chamber. This method tests plural HDDs at a time while lowering the failure rate of the test computers since the test computers are accommodated in a room temperature chamber and not in a high temperature chamber.

The existing IDE (ATA (AT Attachment)) interface can have a maximum of four devices connected thereto. A mother board supporting the IDE interface has two IDE ports. One is called Primary while the other Secondary. To each IDE port, two IDE devices can be connected. One is called Master while the other Slave. Each device to be connected has a jumper switch by which the device is set as Master or Slave. The highest priority is given to Primary Master, followed by Primary Slave, Secondary Master and Secondary Slave in this order.

Thus, a maximum of four HDDs can be tested per tester. In a typical HDD manufacturing test, HDDs are tested by making them execute many commands. For each command, a process composed of command issuance, data transfer (when needed to process the command) and drive status confirmation is executed as a unit of test. In the case of testing four HDDs by one tester, command issuance, data transfer and status verification are done as a unit of test with the four HDDs by turns.

To test two HDDs connected to an IDE adapter connected to a test computer by the method described in Patent Document 1, the above-mentioned command issuance through status confirmation process must be done for each command as a unit of test with the two HDDs in turn. That is, although plural HDDs are connected to one test computer, the test computer issues one command to only one HDD at a time. Therefore, the test time may be long although the occupied space can be reduced as compared with a one-for-one configuration which connects one test computer to each HDD.

On the other hand, each HDD may execute one of a number of different activity sequences to process a command depending on whether an error occurs. It is therefore feasible for a test computer to issue the same command to, for example, two HDDs at the same time. If one HDD does not execute an operation as required, testing of the other HDD may continue to be impossible while the failed HDD is inspected by another command, resulting in making the test time longer on the contrary.

BRIEF SUMMARY OF THE INVENTION

The present invention has been made to solve the above-mentioned problem. It is a feature of the present invention to provide a data storage device test method and data storage device manufacture method which allow a tester to perform an operation test of plural data storage devices connected thereto in a shorter period of time.

The present invention provides a data storage device test method which performs an operation test of each of plural data storage devices connected to a tester by making the plural data storage devices execute commands received from the tester, wherein, during a waiting period when exchange stops between the tester and a data storage device of which operation test is being executed, the tester executes the operation test of another one of the plural storage devices.

Since the tester executes the operation test of another one of the plural storage devices during a waiting period when exchange stops between the tester and a data storage device of which operation test is being executed, the present invention can shorten the test time by raising the testing efficiency.

The waiting period may be included in a period between the moment when a command is received by a data storage device and the moment when a completion notification is made by the data storage device after processing of the command is completed. This makes it possible to effectively use a waiting period which occurs until a command is executed by a data storage device and a command completion notification is done.

Alternatively, the waiting period may be a period between the moment when execution of a command is completed by a data storage device and the moment the data storage device becomes ready to receive the subsequent command. This makes it possible to effectively use a waiting period which occurs until a data storage device becomes ready to receive a command.

Further, the waiting period may be a period during which a data storage device continues to be idle as specified in a test step which comprises one or plural commands and constitutes part of the operation test. This makes it possible to effectively use idle periods of each data storage device.

In addition, the data storage device test method may be such that: the operation test is composed of plural test steps; a plurality of testers are connected with a host device, each tester is connected with plural data storage devices and, each time one test step is completed by one data storage device, the execution result is sent from the tester to the host device; the waiting period is a period between the moment when a test step is completed by a data storage device connected to a tester and the moment when communication becomes possible to send the execution result of the test step to the host device from the tester; and during the waiting period, the operation test of another data storage device, which is connected to the tester and has not completed the test step, is executed. Therefore, such a waiting period which lasts until communication becomes possible between a tester and the host device can effectively be used to test another data storage device.

In this case, during such a waiting period, it is possible, for example, to issue a command or data needed to process the command to another data storage device.

In addition, the data storage device test method may be such that: the operation test of each data storage device is executed in such a repetitive manner that the tester checks whether a data storage device is ready to receive a command, if the data storage device is ready, the tester issues a command to the data storage device, the tester checks whether the data storage device has completely executed the command and has become ready to receive the subsequent command, and, if the data storage device has become ready, the tester issues the subsequent command to the data storage device; and the waiting period corresponds to at least one of a period until a data storage device becomes ready to receive a command and a period until it is verified that the data storage device has completed processing of the command and, during the waiting period, the tester can issue a command to another data storage device if that other storage device is ready to receive a command. Therefore, such a waiting period which occurs with one data storage device can effectively be used to execute the operation test of another data storage device depending on its state.

In addition, the data storage device test method may be such that: the operation test of each data storage device is executed in such a repetitive manner that the tester checks whether a data storage device is ready to receive a command, if the data storage device is ready, the tester issues a command to the data storage device, if data is needed to execute the command, the tester transfers the data to the data storage device and checks whether the data transfer is completed, the tester checks whether the data storage device has completely executed the command and has become ready to receive the subsequent command and, if the data storage device has become ready, issues the subsequent command to the data storage device; and the waiting period corresponds to at least one of a period until a data storage device becomes ready to receive a command, a period until a data transfer is completed and a period until it is verified that the data storage device has completed processing of the command and, during the waiting period, the tester issues a command to another data storage device if that other data storage device is ready to receive a command or data to that other data storage device if data transfer is possible. Therefore, such a waiting period which occurs with one data storage device can effectively be used by executing the operation test of another data storage device depending on its state.

In addition, the plural data storage devices may be connected to the tester via respective separate buses. This makes it possible to separately issue commands and transfer data to the respective data storage devices and makes alternate master/slave setting unnecessary.

In addition, the data storage device test method may be such that: if necessary, a test step, which is composed of one or plural commands and constitutes a part of the operation test, is executed with each data storage device by the tester on a one for one basis; and if a test step is executed with a data storage device on a one for one basis, testing of the other data storage devices is halted until the one for one test step is completed. This makes it possible to execute, for example, a speed performance test step between the tester and a data storage device on a one for one basis.

Further, the present invention provides a data storage device manufacture method including an operation test, wherein: the operation test of each assembled data storage device is done; the operation test is done by connecting plural assembled data storage devices to a tester; and during a waiting period when exchange stops between the tester and a data storage device of which operation test is being executed, the tester executes the operation test of another one of the plural storage devices.

In this case, the operation test is done by a tester which is connected to plural assembled data storage devices. If exchange stops between the tester and a data storage device of which operation test is being executed, the tester can execute the operation test of another data storage device. This allows efficient testing and therefore improves the mass productivity of the data storage device.

In addition, the operation test may be such that: one of the plural data storage devices connected to the tester is checked whether the data storage device is ready to receive a command; if the data storage device is ready to receive a command, the data storage device receives a command issued from the tester; the data storage device executes the received command and then notifies the tester that the command execution is complete; and during the waiting period which lasts until it is verified by the tester that the data storage device is ready to receive a command or until the tester is notified of the completion of the command execution, the tester can execute the operation test of another one of the plural data storage devices. This shortens the test time.

In addition, the operation test may be such that: the data storage device also receives the data needed to process the command from the tester; and during the waiting period between the moment when the data storage device receives the data and the moment when the data storage device completes processing of the command, the operation test of another data storage device can be executed. Therefore, while data is being transferred to one data storage device or while processing is being executed based on the transferred data, it is possible to execute the operation test of another data storage device.

In addition, the operation test may be such that during the waiting period, if another storage device is ready to receive a command, the tester can issue a command to that other data storage device and, if data is needed to process the command, the tester can transfer the data. This makes it possible to appropriately execute the operation test of other data storage devices according to their respective states.

In addition, the data storage device is a hard disk drive, the hard disk drive comprises a constructed hard disk assembly, and the hard disk assembly has a control board installed thereto. In addition, the tester has adapters mounted thereon and the operation test is done by the tester whose adapter cards are connected via separate buses to the control cards which are installed to plural hard disk assemblies, respectively. This allows each device to be set freely without master/slave discrimination or the like. Since it is therefore possible to, for example, independently issue a command and transfer data to each device, the testing flexibility is raised.

According to the present invention, it is possible to provide a data storage device test method and data storage device manufacture method which allow a tester to perform an operation test of plural data storage devices connected thereto in a shorter period of time.

DETAILED DESCRIPTION OF THE INVENTION

With reference to the drawings, the following will provide a detailed description of a specific embodiment of the present invention. In this embodiment, the present invention is applied to an HDD test method and an HDD manufacture method that can shorten a post-assembly test time by carrying out the test method.

In the present embodiment, a real time OS for embedded application is mounted on a tester. By this OS, times which would otherwise be spent to wait for statuses, etc. from drives are assigned to the testing of other drives. This makes it possible to efficiently test multiple drives at a time. As compared with the conventional sequential method, it is possible to shorten the test time by up to about 50%.

Further, the tester has two adapter cards each of which can be connected to two HDDs. Since the FPGA (Field Programmable Gate Array) which functions as a controller on each adapter card is provided with a separate bus for each HDD, one CPU board (tester) can test four drives at a time without master/slave discrimination. That is, one CPU board of this tester can test four HDDs at a time as if four CPU boards tested them. Thus, since each HDD does not require special setting, each HDD can be flexibly set and tested by the tester.

Figure 1:
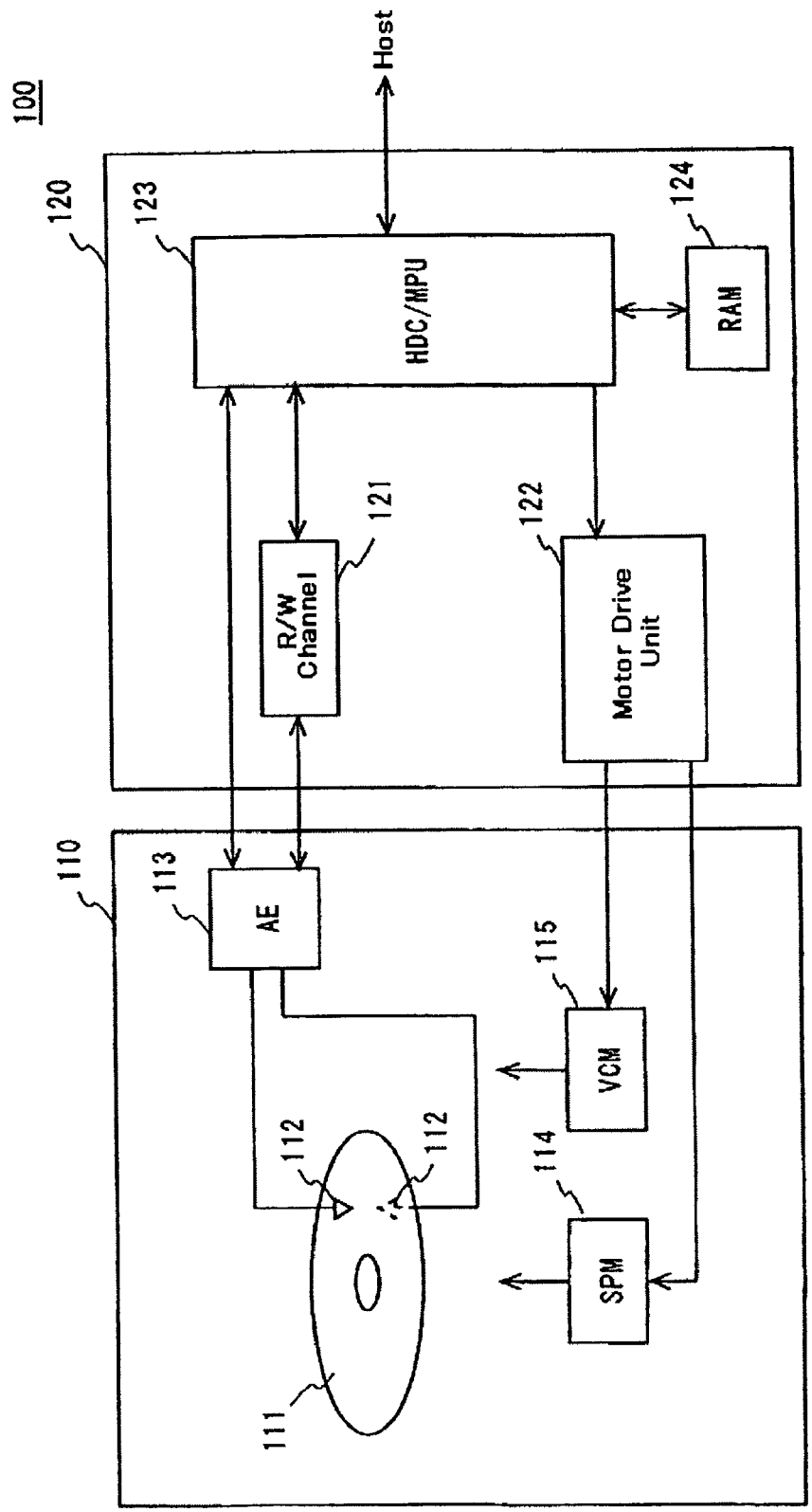
FIG. 1 is a schematic block diagram of an HDD.

Firstly, to facilitate understanding of the present embodiment, the following provides a general description of an HDD. FIG. 1 is a block diagram which schematically shows the HDD. As shown in FIG. 1, the HDD 100 has a magnetic disk 111, heads 112, arm electronics (AE) 113, a spindle motor (SPM) 114 and a voice coil motor (VCM) 115 in a case 110. They constitute a hard disk assembly (HDA). In addition, the HDD 100 is provided with a circuit board 120 as a control board fixed to the outside of the case 110. On the circuit board 120, there are provided a read/write channel (R/W channel) 121, a motor drive unit 122, a hard disk controller (HDC)/MPU integrated circuit (hereinafter HDC/MPU) 123 and a memory 124 such as a RAM.

Write data from an external host is received by the HDC/MPU 123 and written to the magnetic disk 111 by a head 112 via the R/W channel 121 and the AE 113. In addition, data stored on the magnetic disk 111 is read out by a head 112 and output to an external host from the HDC/MPU 123 via the AE 113 and the R/W channel 121.

The HDD's components are each described below. The magnetic disk 111 is fixed around the rotary shaft of the SPM 114. The SPM 114 is driven by the motor drive unit 122 to rotate the magnetic disk 111 at a certain speed. The magnetic disk 111 has a recording surface on each side thereof and each recording surface is associated with a head. Each head 112 is fixed to a slider (not shown in the figure) which is fixed to a carriage (not shown in the figure). The carriage (not shown in the figure) is fixed to the VCM 115 which pivots the carriage to move the slider and heads.

Typically, each head 112 has a write head and a read head integrated thereon. The write head converts an electric signal to a magnetic field according to the write data to the magnetic disk 111 while a magnetic field from the magnetic disk 111 is converted to an electric signal by the read head. Note that one or more magnetic disks 111 may be installed, each of which may have a recording surface formed on either one side or both sides thereof.

Each circuit section is described below. From the plural heads 112, one head which is to access data is selected by the AE 113. A reproducing signal, picked up by the selected head 112, is amplified (preamplified) at a certain gain by the AE 113 and sent to the R/W channel 121. In addition, the recording signal from the R/W channel 121 is sent to a selected head 112 by the AE 113. In particular in the present embodiment, from the recording signal sent from the R/W channel 121, the AE 113 detects the target high frequency pattern which is to be amplified. A write driver included in the AE 113 amplifies only this high frequency pattern to generate a write current which is supplied to the write head. This can suppress the influence of ATI while improving the overwrite characteristic as described later in detail.

Data obtained from the host undergoes write processing which is executed by the R/W channel 121. In the write processing, the R/W channel 121 performs code-modulation on the write data supplied from the HDC/MPU 123 and converts the code-modulated write data to a write signal (current) which is supplied to the AE 113. In addition, when data is supplied to the host, the R/W channel 121 performs read processing.

In the read processing, the R/W channel 121 amplifies the read signal, supplied from the AE 113, to a certain amplitude, extracts data from the obtained read signal and performs decode processing on the extracted data which contains user data and servo data. The decoded read data are supplied to the HDC/MPU 123.

The HDC/MPU 123 is a single chip where MPU and HDC circuits are integrated. Operating according to microcodes loaded into the RAM 124, the MPU executes processes necessary for data processing as well as general control of the HDD 100 including positioning control of the head 112, interface control and defect management. When the HDD 100 is started, microcodes which are to operate on the MPU and data to be required for control and data processing are loaded into the RAM 124 from the magnetic disk 111 or ROM (not shown).

Provided with the capability to interface with the host, the HDC/MPU 123 receives user data and read, write and other commands sent from the host. The received user data is transferred to the R/W channel 121. The HDC/MPU 123 also obtains read data from the magnetic disk through the R/W channel 121 and sends it to the host. In addition, the HDC/MPU 123 performs error correction code (ECC) processing on the user data obtained from the host or read out from the magnetic disk 111.

The data read out by the R/W channel 121 contains servo data as well as user data. By using the servo data, the HDC/MPU 123 performs positioning control of the head 12. The control data from the HDC/MPU 123 is output to the motor drive unit 122. The motor drive unit 122 supplies current to the VCM 115 according to the control signal. In addition, the HDC/MPU 123 controls the data read/write processing by using the servo data.

When such an HDD as mentioned above is manufactured, an HDA is assembled, a circuit board 120 is installed thereto, and then the HDA having the circuit board 120 installed thereto undergoes optimization and inspection stages to optimize various parameters and check whether various functions work normally. These stages include, for example, a servo information write stage, a pretest stage to optimize servo- and channel-related various coefficients and a function/reliability verification test (hereinafter denoted as operation test) stage.

The operation test checks whether an HDD can normally execute various commands issued from the host. This operation test is carried out by connecting the HDD under test to a tester which makes the HDD execute various commands. To test the HDD, the tester issues various commands and checks if the HDD normally processes each command. This test requires a very long test time and therefore lowers the mass productivity of the HDD.

Accordingly, the present embodiment intends to shorten such a long test time. As mentioned above, a tester typically uses two IDE ports, allowing two adapter cards to be attached thereto. Each adapter card has a FPGA (Field Programmable Gate Array) mounted thereon which serves as an AT/PC-MICA (Personal Computer Memory Card International Association) interface controller. Since two HDDs can be connected to one FPGA, a maximum of four HDDs can be tested at a time.

To mass-produce HDDs and lower the manufacturing cost, it is preferable to minimize the above-mentioned test time which usually amounts to several tens of hours. It is also preferable to test HDDs in a smaller space by connecting as many HDDs as possible to one tester (one CPU board).

In the conventional method, however, each command is exclusively executed as a unit of test until the status is confirmed after the command was issued. Therefore, although connecting a maximum of four HDDs to one tester as mentioned above reduces the space, it is difficult to shorten the test time since the four HDDs must be tested sequentially for each command which is started by issuing the command and ended by confirming the status. Further, if two HDDs are connected to each adapter card, they cannot be set up flexibly for the purpose of testing since usually it is necessary to set one as master and the other as slave.

However, while each command comprises a command issuance step, a data transfer step and a status confirmation step to check whether the command is normally executed and the HDD is ready to accept the next command, there are waiting times between the command issuance step and the data transfer step and between the data transfer step and the status confirmation step. The present embodiment intends to shorten the test time by issuing the command to another HDD and transferring data during these waiting times when no exchange is done between the tester and the HDD. That is, the present embodiment realizes a reduction of the test time by issuing a command and transferring data to other HDDs during execution of the command after the command is issued to a HDD and/or until the HDD becomes ready to accept the next command through the status confirmation.

A tester which executes a test on four HDDs is connected to a host computer. The host computer is connected with a plurality of testers. From each tester, the host computer receives results of testing the four HDDs connected to the tester. The test by the tester is composed of, for example, several tens of test steps (test items). In the present embodiment, each time one step is completed with any HDD, the tester sends to the host computer a result indicating the HDD passed or failed the test step. The host computer is connected with, e.g., sixty testers. Each tester makes the test more efficient by issuing commands and transferring data to other HDDs before the tester becomes able to access the host computer (while waiting for a polling packet).

Further, since the present invention uses separate buses between each adapter card and two HDDs, the FPGA mounted on the adapter card can be connected to the two HDDs without master/slave discrimination. This intends to shorten the test time by allowing each tester to set four HDDs flexibly without master/slave discrimination and four HDDs to more efficiently execute commands.

According to the above-mentioned scheme, however, although each tester can almost concurrently test all of the four HDDs which are connected thereto, it is not possible to perform seek time measurement and other speed performance test steps under optimum conditions since processing with another HDD may be done while one command is processed with one HDD. That is, in the case of a speed performance test step, a "one tester (1 CPU) for one HDD" configuration is necessary in order to test each HDD under the same condition. According to the aforementioned scheme, if a waiting time occurs while one step comprising one or plural commands is executed, testing of another HDD is advanced. This may make it impossible to perform speed performance measurement under the same condition. Therefore, when a speed performance test step is to be done, the present embodiment halts the testing of the other HDDs so as to test each HDD on a "one tester (1 CPU) for one HDD" basis. This makes it possible to perform accurate speed performance measurement in the present embodiment by setting a "one tester (1 CPU) for one HDD" configuration as necessary.

Figure 2:
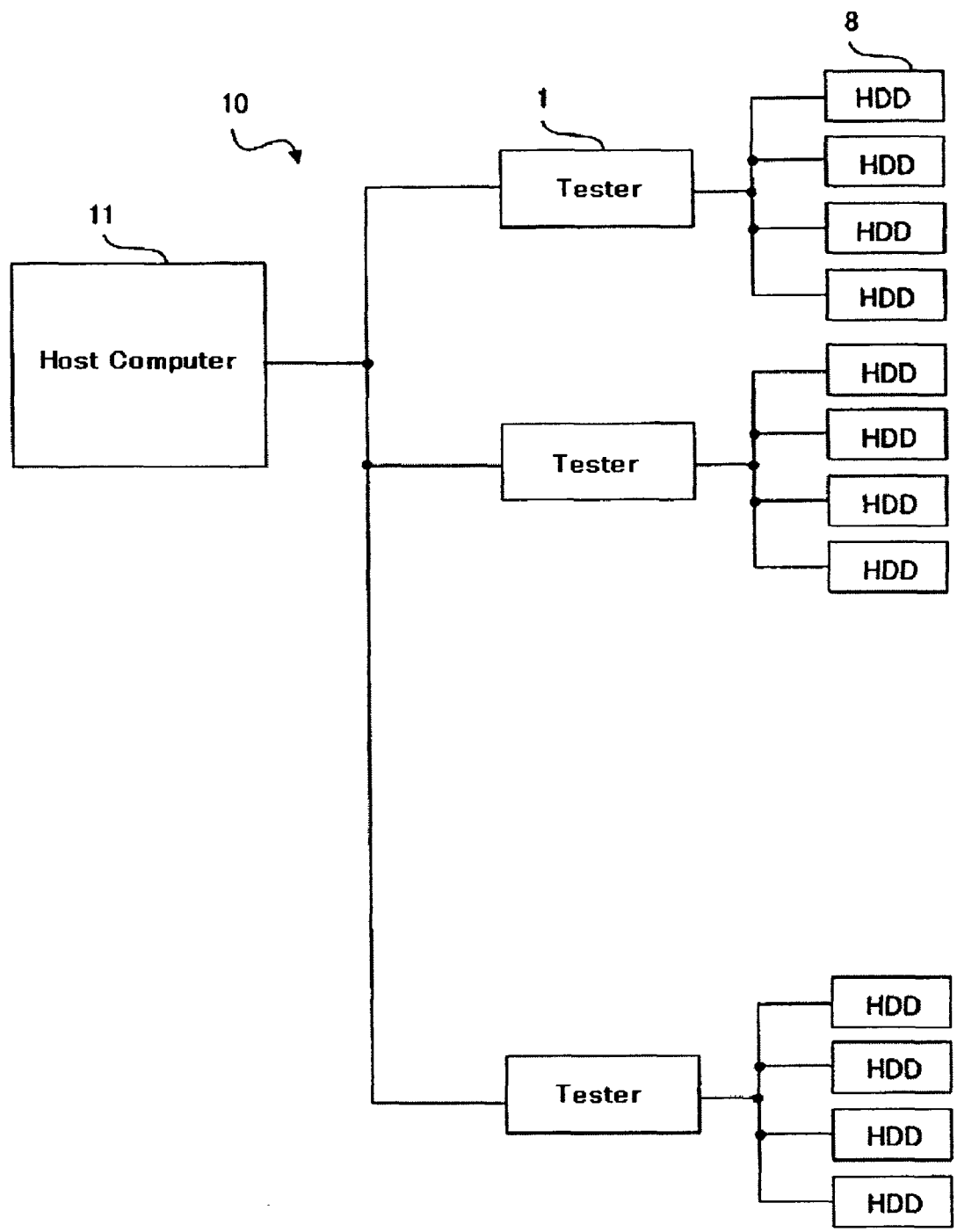
FIG. 2 is a schematic diagram showing a test system according to an embodiment of the present invention.

FIG. 2 is a schematic diagram showing a test system according to the present embodiment. The test system 10 has a host device 11, a plurality of testers 1 connected to the host device, and a plurality of (four in this specific embodiment) HDDs 8 connected to a corresponding one of the testers 1. The host device 11 supplies to each tester 1 a test program (script) to test each HDD 8. The test program is composed of, for example, several tens of kinds of test steps (test items). Each test step is composed of one or plural commands. For example, a write operation test step is a sequence of activities such as issuing a write command, transferring write data and an address, judging whether the write operation succeeded and, if an error occurred, executing a retry operation directly or after changing/adjusting write operation-related various parameters.

Each tester 1 executes testing of four HDDs 8 in a substantially concurrent manner as described later. Each time one test step is completed with one HDD 8, the corresponding tester 1 sends the execution result to the host device 11. The host device 11 logs the execution result of each test step with each HDD 8. After all steps of the test are completed, these execution results are stored in a database or the like for use in various error analyses. In the present embodiment, the host device 11 is serially connected with, for example, sixty testers 1.

Figure 3:
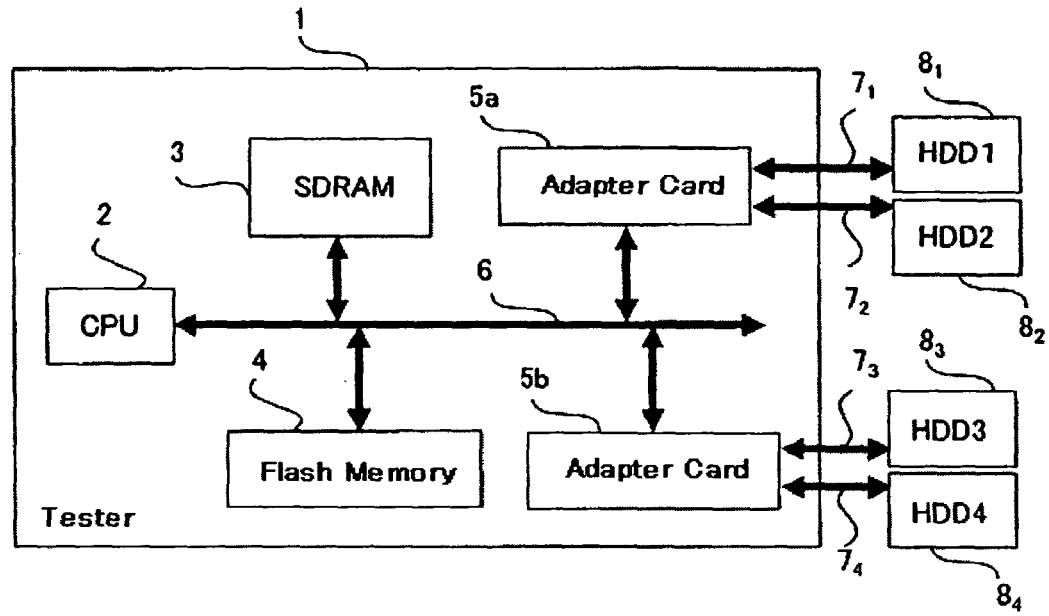
FIG. 3 shows how HDDs under test are connected to a tester in the present embodiment.

FIG. 3 shows how HDDs under test are connected with the tester of the present embodiment. In the tester 1, as shown in FIG. 3, a CPU 2 is connected with an SDRAM 3, a flash memory 4 and two adapter cards 5a and 5b via a bus 6. The adapter cards 5a and 5b has two buses $7_1$-$7_2$ and $7_3$-$7_4$, respectively. The buses $7_1$, $7_2$, $7_3$ and $7_4$ are connected to HDDs under test $8_1$, $8_2$, $8_3$ and $8_4$, respectively.

The CPU 2 of the tester 1 issues a command to each of the HDDs $8_1$-$8_4$ via the associated adapter card 5a or 5b, transfers data if necessary and receives a command execution result. The command execution result of each of the HDDs $8_1$-$8_4$ is output to the outside or displayed via a monitor. To perform an operation test of each of the HDDs $8_1$-$8_4$, the tester 1 reads out a program to execute a sequence of commands from the flash memory 4 and issues these commands one by one to each of the HDDs $8_1$-$8_4$ for execution depending on its command execution state. If one of the HDDs $8_1$-$8_4$ receives a data write instruction (write command), the HDD receives write data and a write address and writes the received data to the received address. If a data read instruction (read command) is received, the HDD receives a read address and a read data recording SDRAM address, reads out data from the received address and writes the read data to the SDRAM 3. The tester 1 judges that the read is normally done if reading the data into the SDRAM 3 causes no error. In this case, the tester 1 advances to execution of the next command. If a write error or read error occurs with any of the HDDs $8_1$-$8_4$, for example, the tester 1 issues the command again to the HDD for re-execution or issues an error correction command thereto. Thus, each of the HDDs $8_1$-$8_4$ executes a different command depending on its command execution state and on the presence or absence of an error.

In the present embodiment, the adapter cards 5a and 5b are connected with the HDDs $8_1$-$8_2$ and $8_3$-$8_4$, respectively, via the separate ATA buses $7_1$, $7_2$, $7_3$, and $7_4$, respectively. It is possible to issue commands individually to the respective HDDs $8_1$-$8_4$. For example, even while one HDD, say HDD $8_1$ is processing a command issued thereto, a command can be issued to another HDD $8_2$. Thus, it is not necessary to process a command, including issuing the command, performing a data transfer and terminating the command processing, as a unit of test. For example, when the tester 1 is waiting for the HDD $8_1$ to become ready to accept a command, the tester 1 can issue a command to another HDD $8_2$, $8_3$ or $8_4$ and, after the command is issued, perform a data transfer by its DMA transfer function. In addition, since the HDDs $8_1$-$8_4$ are connected to the tester 1 via the separate buses $7_1$-$7_4$, respectively, it is possible to perform data transfers simultaneously with the four HDDs. Further, the two HDDs $8_1$-$8_2$ and $8_3$-$8_4$ which are connected to the adapter cards 5a and 5b, respectively, need not be set as master and slave alternately. For example, it is possible to set all of the four HDDs as either masters or slaves. This raises the testing flexibility.

Figure 4:
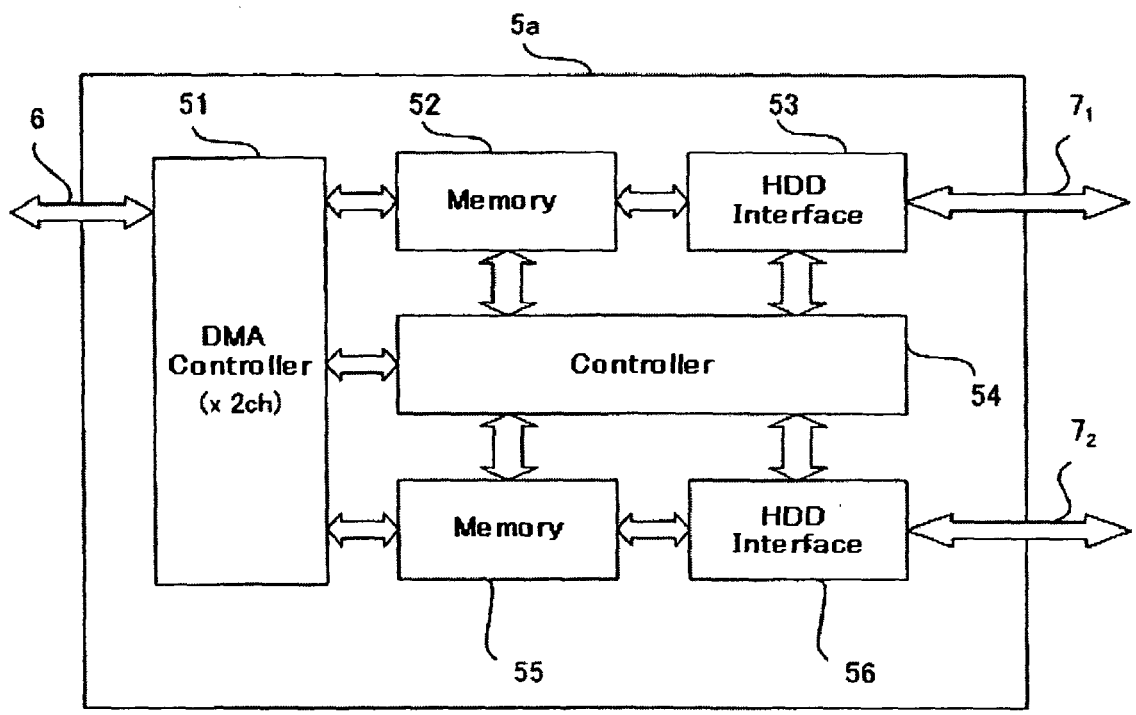
FIG. 4 is a block diagram showing an adapter card in the present embodiment.

FIG. 4 is a block diagram showing the adapter card 5a of the present embodiment. The adapter card 5b is configured in the same manner. As shown in FIG. 4, the adapter card 5a has a DMA controller 51, memories 52 and 55, HDD interfaces 53 and 56 and a controller 54. The adapter card 5a of the present embodiment issues commands and transfers data individually to two HDDs. Accordingly, the DMA controller 51 is configured so as to control DMA in two channels.

Composed of, for example, a FIFO, the memory 52 holds data for the HDD $8_1$. For example, if a command is issued as a write instruction, the data to be written is stored there via the DMA controller 51. Also via the DMA controller 51, a write address and other setting values are sent to the controller 54. Based on this address and other setting values, the controller 54 controls the HDD interface 53 to write the write data held in the memory 52 to the HDD $8_1$. If a read command is received, an address from which data is to be read out is supplied. Data is read out from that address in the HDD $8_1$ and stored in the memory 52 via the HDD interface 53. Likewise, the memory 55 and the HDD interface 56 are used to process commands for the HDD $8_2$. The controller 54 judges whether each command is for the HDD $8_1$ or $8_2$, and controls the corresponding memory 52 or 55 and HDD interface 53 or 56.

As described above, each of the adapter cards 5a and 5b in the present embodiment has a DMA controller and a controller, which control DMA in two channels, and two HDD interfaces each of which is connected with one HDD. That is, since each HDD is provided with an independent ATA bus, it is possible to execute commands individually with two HDDs. If two HDDs are serially connected to a conventional adapter card (such as an ATA port described later) by one bus, one of them must be set as master and the other slave. In the case of the present embodiment, since the two adapter cards 5a and 5b need not be set as master and slave alternately, that is, any of the four HDDs may be set freely as either master or slave, commands can be executed individually via the buses to which the four HDDs are respectively connected.

In addition, since each of the adapter cards 5a and 5b has memories 52 and 55 which are associated respectively with two of the HDDs $8_1$-$8_4$, the tester 1 can issue a command to the HDD $8_2$ and perform data transfer with it while, for example, the HDD $8_1$ is executing an operation to write the data supplied from the memory 52. It is also possible to transfer data to the memory 55 in advance when the HDD $8_2$ is not ready to execute the command. Thus, the tester can effectively use the bus 6 between the adapter cards 5a and 5b.

Further, when the data read out from the HDD $8_1$ is to be written into the SDRAM 3 by DMA, the adapter card 5a performs the write at an appropriate timing selected when the bus 6 is not used. That is, if the CPU 2 is to issue a command or the like to the adapter 5b, the adapter card 5b will write the data after the command is issued. As described with these examples, the singular tester 1 can efficiently execute the test through effective control of the bus 6 by the adapter cards 5a and 5b.

Figure 5:
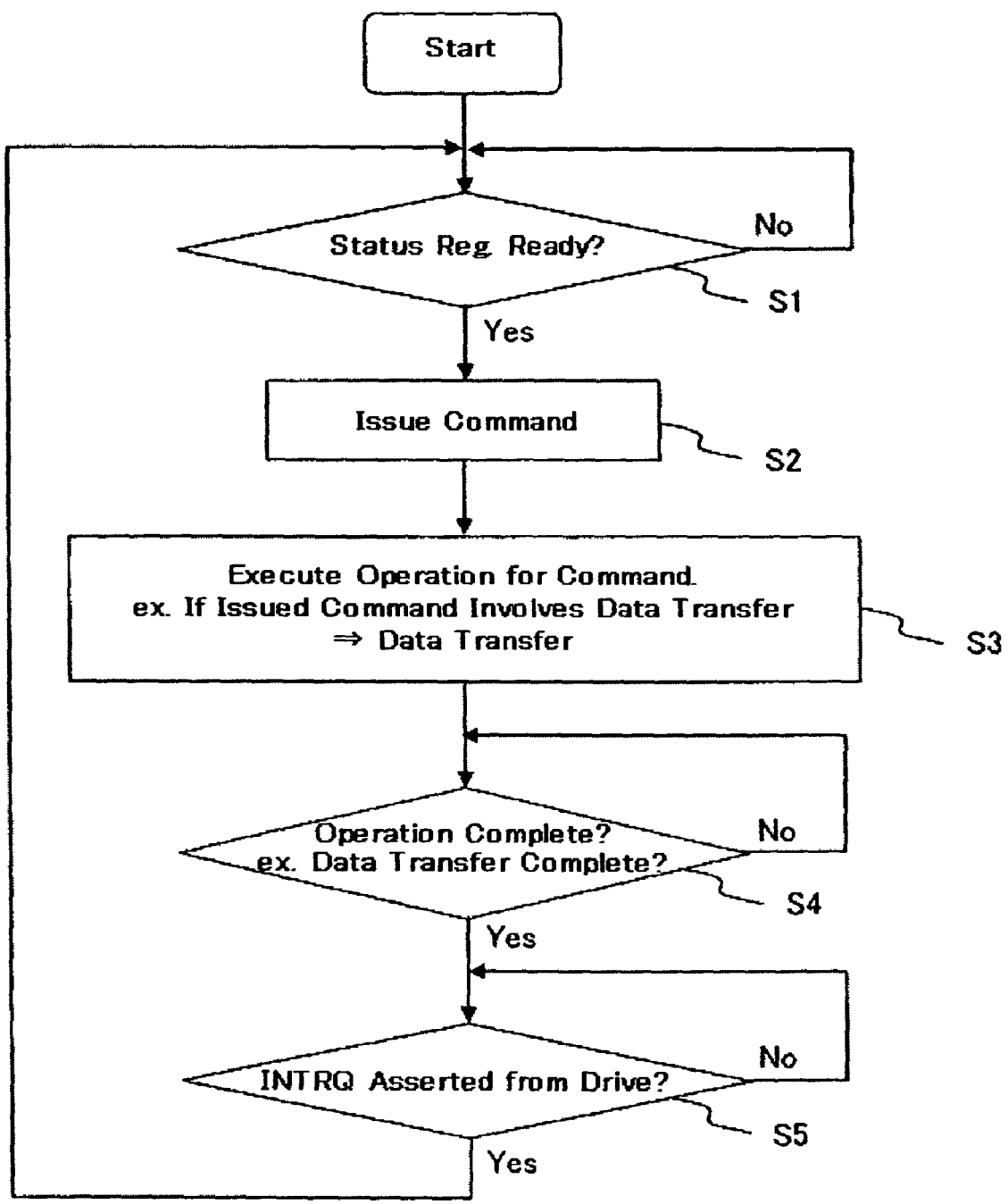
FIG. 5 is a flowchart showing how HDDs are tested in the present embodiment.

The following provides a further detailed description of how a test is performed in the present embodiment. FIG. 5 is a flowchart showing how HDDs are tested in the present embodiment. To execute a command with each HDD or send/receive data to/from each HDD, the tester 1 first accesses the register group in each HDD as shown in FIG. 5. For example, the status register (DRDY: Device Ready) in the HDD $8_1$ is checked to ascertain whether the HDD $8_1$ is ready to accept a command from the tester 1 (step S1). The status register, if the bit is "1", indicates the HDD $8_1$ is ready. If the status register indicates Ready, the tester 1 issues one of various commands such as read command, write command and power control command (step S2).

Upon receipt of a command, the HDD $8_1$ executes an operation for the command (step S3). If the command issued in step S2 is a data transfer-involved command such as a write command, a data transfer is executed. In the case of a write command, data including write data and an address is transferred. Then, it is checked whether the data transfer is complete (step S4). Note that PIO (Programmed I/O) and DMA (Direct Memory Access) are supported as data transfer methods. PIO transfers data to an HDD via the CPU while DMA directly transfers data to an HDD not via the CPU. Further, three DMA modes are supported: Single word DMA, Multi-word DMA and Ultra DMA. In Single word DMA mode, data is transferred word by word. One word is composed of 16 bits. In Multiword DMA mode, plural words of data are successively transferred. In Ultra DMA mode, data transfer is initiated at both leading and trailing edges of the clock signal, realizing a data transfer rate twice as high as that in Multiword DMA mode. One of these data transfer methods is specified by the command.

Finally, it is checked whether the interrupt signal (Interrupt Request) INTRQ is asserted from the HDD as a command completion notification (step S5). If so, the procedure is repeated from step S1. That is, the next command is issued if the HDD again becomes ready to accept a command.

Conventionally, if the status register in the HDD $8_1$ is not set to Ready, the tester waits until HDD $8_1$ becomes ready. In the present embodiment, processing proceeds to other HDDs such as the HDD $8_2$ during this waiting time. In addition, although the tester conventionally does not perform another processing while one command is processed between steps S2 and S5 in FIG. 5, processing is performed with another HDD in the present embodiment, for example, during the waiting time before the data transfer is completed (step S4)

and the waiting time before the interrupt signal is asserted by the HDD which has completed a read or write operation for the command (step 5) in addition to the above-mentioned waiting time.

In other words, a sequence of activities including command issuance, data transfer and command completion notification is not performed as a unit of test. Rather, command issuance, data transfer and command completion notification are separately performed in order to shorten the test time by effectively using the above-mentioned waiting times. The adapter cards 5a and 5b are provided with memories which are respectively associated with the HDDs. For data transfer, data transferred to execute a command is once stored in the corresponding memory into the associated memory in the adapter cards 5a and 5b so as to effectively use a free time of the bus 6. The controller in each of the adapter cards 5a and 5b controls the adapter card so as to write data to the HDD at a certain timing and write temporarily stored read data into the SDRAM 3 by using a free time of the bus 6.

If the status register does not indicate Ready in step S1, processing proceeds to the next HDD. Then, if the HDD $8_2$ has not completed step S4, it is checked whether, for example, a data transfer has completed. If not, processing proceeds to the HDD $8_3$. Thus, if the current HDD poses any of the above-mentioned waiting times, testing proceeds to another HDD. This makes it possible to efficiently execute the test by effectively using one tester (one bus 6) for four HDDs.

As mentioned above, waiting times occur before the status register is set to Ready, a data transfer is completed and the interrupt signal is asserted by the HDD which has completed a read or write operation for the command. In addition, it is also possible to issue a command and transfer data to another HDD while the current HDD is doing nothing in terms of application (idle, sleep or the like). For example, if the test includes an instruction to place the current HDD into the idle state for a certain period, say, several seconds, or a command or operation test step which poses an idle period before executing a certain operation, it is possible to test another HDD while the current HDD is idle.

Further, a plurality of testers are connected to a single host computer in the present embodiment as shown in FIG. 2. Each tester 1 sends to the host device 11 the result of each test step done with each of the HDDs $8_1$-$8_4$ connected to itself. In the present embodiment, since each tester 1 tests four HDDs, sixty testers 1 test a total of 240 HDDs at most in a substantially concurrent manner. Therefore, a waiting time occurs if a tester 1 is to send to the host device 11 the result of a test step done with an HDD. The tester 1 executes testing of another HDD until the host device 11 becomes ready to communicate with the tester (while the tester 1 is waiting for a polling packet from the host device 11).

For example, when a tester 1 is going to notify the host device 11 of the result of a test step done with an HDD $8_1$, the tester 1 issues a command and transfer data to another HDD $8_2$ if possible during the waiting time before the host device 11 becomes ready to communicate with the tester 1. If the result of a test step done with the HDD $8_2$ also must be sent to the host device 11 or the HDD $8_2$ is processing a command, the tester 1 may issue a command or transfer data to HDD $8_3$. Thus, the present embodiment further shortens the test time by testing another HDD during a waiting time before the host device 11 becomes ready to communicate with the tester 1.

Basically, according to the test method of the present embodiment, if a waiting time occurs while one command is executed with one HDD, the tester may issue a command or transfer data to another HDD in order to efficiently test plural HDDs in a shorter time by one tester. However, this poses a problem in that seek time and other speed performance test steps cannot be done with all HDDs under equal or desirable conditions. Accordingly, speed performance and other time-critical test steps must be done by executing commands on a "one tester for one HDD" basis.

As described earlier, the host device 11 has a script where test flows are described to test each HDD. Based on this script, the testers 1 execute testing of each HDD. This script is designed to call a certain function when the subsequent test step must be done on a "one tester (CPU) for one HDD" basis.

Specifically, for example, when a speed performance test step or the like must be done with one HDD $8_1$ on a "one tester for one HDD" basis, a certain flag to perform a "one tester for one HDD" test step is set for the HDD $8_1$. Usually, when the flag is set, other HDDs are executing other test steps or commands and cannot immediately terminate processing. Therefore, the HDD $8_1$, for which the flag is set, waits until each HDD reaches a certain point of testing, that is, for example, until the currently executed test step (test item) or command is completed.

If each of the other HDDs completes execution of the current test step or command, it checks whether the above-mentioned flag is set. If this flag is set, the other HDDs halt testing upon completion of executing the current test steps or commands until the flag is cleared. If all HDDs other than the HDD $8_1$ enter the idle state, the HDD $8_1$, for which the above-mentioned flag is set, executes testing with the tester 1 on a "one for one" basis. The other HDDs halt testing until the flag set for the HDD $8_1$ is cleared, that is, the speed performance test step is completed. If the speed performance test step is completed with the HDD $8_1$, the flag is cleared to allow the other HDDs to resume the operation test. Thus, an HDD for which the flag is set can perform testing with the tester 1 on a "one for one" basis. In addition, the flag is always cleared upon completion of the speed performance test step, allowing the other HDDs to resume testing.

By using this flag as necessary, it is possible for a tester to execute testing of each HDD on a "one for one" basis. Thus, while four HDDs can efficiently be tested in a substantially concurrent manner, it is also possible to accurately perform such test steps as speed performance test steps.

Needless to say, the present invention is not limited to the embodiment described so far, and various modifications are possible without departing from the spirit of the invention. In the embodiment described so far, each of two ATA ports on each tester has an adapter card mounted thereon. Two HDDs are respectively connected to an adapter card via two separate buses. This allows free master/slave setting and concurrent data transfers with four HDDs.

Figure 6:
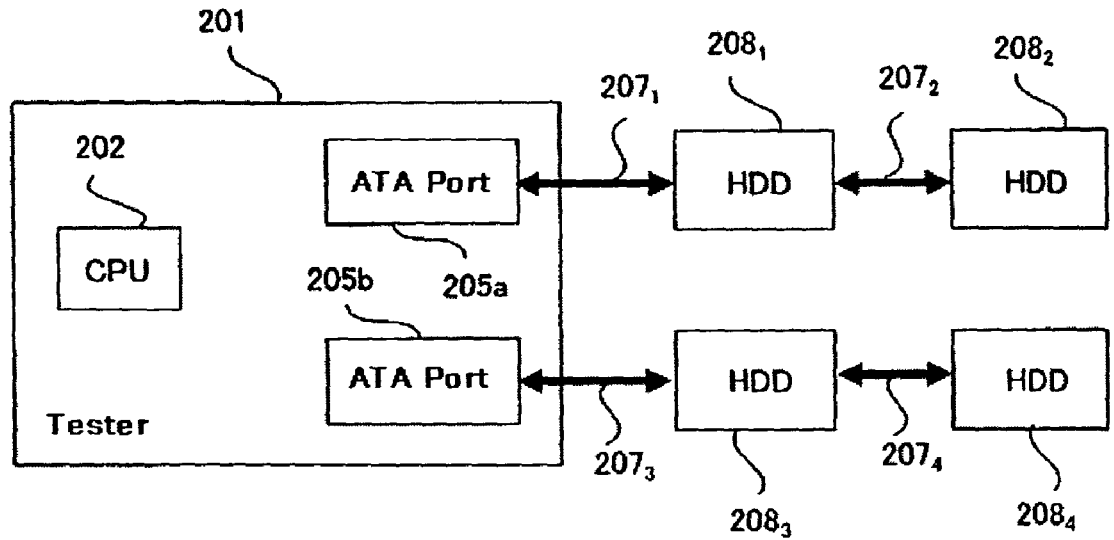
FIG. 6 shows how a conventional tester is connected with HDDs under test.
Figure 7:
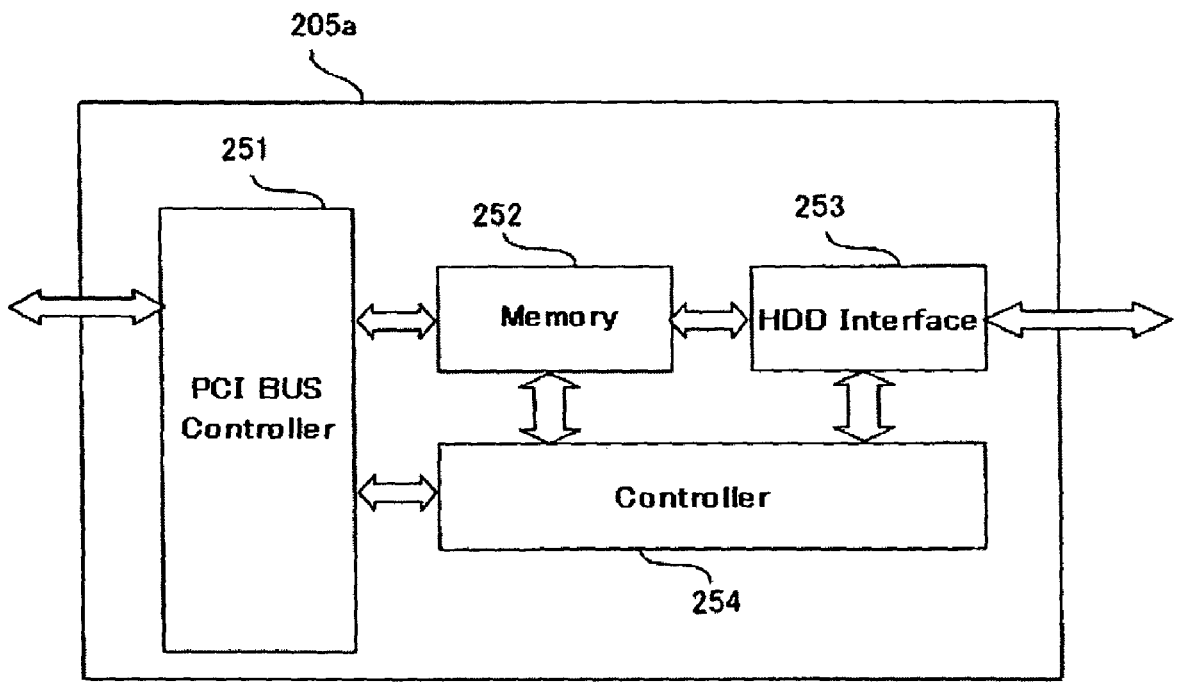
FIG. 7 shows a conventional ATA port.

In the case of FIGS. 6 and 7, a tester is conventionally connected with HDDs under test via conventional ATA ports. As shown in FIGS. 6 and 7, it is common to connect HDDs $208_1$ and $208_3$ to two ATA ports 205a and 205b of tester 201 via buses $207_1$ and $207_3$, respectively, and connect HDDs $208_2$ and $208_4$ to the HDDs $208_1$ and HDD $208_3$, respectively. The ATA port 205a is provided with a PCI bus controller 251, a memory 252 such as FIFO, a HDD interface 253 and a controller 254. The ATA port 205a transfers a command and data to the HDD 208, via the bus 207, and further to the HDD $208_2$ via the bus $207_2$. In this case, one of HDDs $208_1$ and $208_2$ must be set as master while the other slave. As compared with the tester 1 provided with an adapter which is connected with a HDD via a separate bus as mentioned above, this configuration is inferior in terms of testing flexibility.

Also in the case of the conventional tester 201, however, while one ATA port is on standby, that is, waiting until the connected HDD becomes ready to accept a command, until transfer of write data or the like from the memory 252 to the HDD is completed or until a command completion notification is sent from the HDD, it is possible to execute testing of the HDD connected to the other ATA port. Thus, it is possible to raise the mass productivity of HDDs by shortening the test time.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A data storage device test method comprising:
    performing an operation test of each of plural data storage devices connected to tester by making the plural data storage devices execute commands received from the tester, wherein the operation test comprises a first portion and a second portion,
    wherein the tester transfers data involved in the operation test to the plural data storage devices using Direct Memory Access (DMA),
    wherein, in the first portion of the of the operation test, during a waiting period when exchange is paused between the tester and a data storage device of which operation test is being executed, the tester executes the operation test of another one of the plural storage devices,
    wherein, in the first portion of the operation test, when the waiting period of the paused exchange between the tester and said data storage device expires, the tester pauses the operation test of said other one of the plural storage devices to resume the operation test of said storage device, and
    wherein, in the second portion of the operation test, in response to a determination that a speed performance test is to be performed on the data storage device, the tester halts the testing of all other of the plural storage devices so that a central processing unit (CPU) of the tester may be dedicated to performing the speed performance test on the data storage device.

2. A data storage device test method according to claim 1, wherein said waiting period is included in a period between the moment when a command is received by said data storage device and the moment when a completion notification is made by said data storage device after processing of the command is completed by said data storage device.

3. A data storage device test method according to claim 1, wherein said waiting period is a period between the moment when execution of a command is completed by said data storage device and the moment said data storage device becomes ready to receive a subsequent command.

4. A data storage device test method according to claim 1, wherein:
    said operation test is composed of plural test steps each of which is composed of one or plural commands; and
    said waiting period is a period during which said data storage device continues to be idle as specified in one of the test steps.

5. A data storage device test method according to claim 1, wherein:
    said operation test is composed of plural test steps;
    a plurality of said testers are connected with a host device, each said tester is connected with plural data storage devices and, each time one test step is completed by one data storage device, an execution result thereof is sent from said tester to the host device;
    said waiting period is a period between the moment when a test step of the plural test steps is completed by a data storage device connected to a tester and the moment when communication becomes possible to send the execution result of the test step to the host device from the tester; and
    during said waiting period, the operation test of another data storage device, which is connected to the tester and has not completed the test step, is executed.

6. A data storage device test method according to claim 1, wherein a command is issued to another data storage device during said waiting period.

7. A data storage device test method according to claim 1, wherein data needed to process a command is transferred to another data storage device.

8. A data storage device test method according to claim 1, wherein:
    the operation test of each data storage device is executed in such a repetitive manner that: the tester checks whether a data storage device is ready to receive a command; if the data storage device is ready, the tester issues a command to the data storage device; the tester checks whether the data storage device has completely executed the command and has become ready to receive a subsequent command; and, if the data storage device is ready, the tester issues the subsequent command to the data storage device, and
    said waiting period corresponds to at least one of a period until a data storage device becomes ready to receive a command and a period until it is verified that the data storage device has completed processing of the command and, during said waiting period, the tester issues a command to another data storage device if the another data storage device is ready to receive a command.

9. A data storage device test method according to claim 1, wherein:
    the operation test of each data storage device is executed in such a repetitive manner that: the tester checks whether a data storage device is ready to receive a command; if the date storage device is ready, the tester issues a command to the data storage device; if data is needed to execute the command, the tester transfers the data to the data storage device and checks whether the data transfer is completed; the tester checks whether the data storage device has completely executed the command and has become ready to receive a subsequent command; and, if the data storage device is ready, the tester issues the subsequent command to the data storage device, and
    said waiting period corresponds to at least one of a period until a data storage device becomes ready to receive a command, a period until a data transfer is completed and a period until it is verified that the data storage device has completed processing of the command and, during said waiting period, the tester issues a command to another data storage device if the another data storage device is ready to receive a command or data to the another data storage device if data transfer is possible.

10. A data storage device test method according to claim 1, wherein the plural data storage devices are connected to the tester via respective separate buses.

11. A data storage device test method according to claim 1, wherein a maximum of four data storage devices are connected to the tester.

12. A data storage device test method according to claim 1, wherein the tester has an adapter card to which two data storage devices are connected via respective separate buses.

13. A data storage device test method according to claim 1, wherein:
if necessary, a test step, which is composed of one or plural commands and constitutes part of the operation test, is executed with each data storage device by the tester on a one for one basis; and
if a test step is executed with a data storage device on a one for one basis, testing of the other data storage devices is halted until the one for one test step is completed.

14. A data storage device test method according to claim 1, wherein the tester comprises two IDE adapter cards that each have a Field Programmable Gate Array (FPGA), wherein each of the plural data storage devices is connected to the tester by a separate bus provided by the FPGA of one of the two IDE adapter cards, and wherein none of the plural data storage devices operate as a master or as a slave.

15. A data storage device manufacture method comprising:
assembling a plurality of data storage devices;
connecting the assembled data storage devices to a tester, wherein the tester comprises two Integrated Device Electronics (IDE) adapter cards that each have a Field Programmable Gate Array (FPGA), wherein each of the plural data storage devices is connected to the tester by a separate bus provided by the FPGA of one of the two IDE adapter cards, and wherein none of the plural data storage devices operate as a master or as a slave; and
executing an operation test, comprising a first portion and a second portion, on each of the assembled data storage devices;
wherein, in the first portion of the operation test, during a waiting period when exchange is paused between the tester and a data storage device of which operation test is being executed, the tester executes the operation test of another one of the plural storage devices,
wherein, in the first portion of the operation test, when the waiting period of the paused exchange between the tester and said data storage device expires, the tester pauses the operation test of said other one of the plural storage devices to resume the operation test of said storage device, and
wherein, in the second portion of the operation test, in response to a determination that a speed performance test is to be performed on the data storage device, the tester halts the testing of all other of the plural storage devices so that a central processing unit (CPU) of the tester may be dedicated to performing the speed performance test on the data storage device.

16. A data storage device manufacture method according to claim 15, wherein the operation test is such that:
one of the plural data storage devices connected to the tester is checked to ascertain whether the data storage device is ready to receive a command;
if ready to receive a command, the data storage device receives the command issued from the tester, and the data storage device executes the received command and then notifies the tester that the command execution is complete;
during said waiting period which lasts until it is verified by the tester that the data storage device is ready to receive a command or until the tester is notified of the completion of the command execution, the tester executes the operation test of another one of the plural data storage devices.

17. A data storage device manufacture method according to claim 16,
wherein the operation test is such that:
in addition to the command, said data storage device receives data needed to process the command from the tester; and
said another storage device executes the operation test during said waiting period between the moment when said data storage device receives the data and the moment when said data storage device completes processing of the command.

18. A data storage device manufacture method according to claim 15,
wherein the operation test is such that during said waiting period, if said another storage device is ready to receive a command, the tester issues a command to said another data storage device and, if data is needed to process the command, the tester transfers the data to said another data storage device.

19. A data storage device manufacture method according to claim 15, wherein the operation test is such that:
the operation test is composed of plural test steps each of which is composed of one or plural commands; and
said waiting period is a period during which the data storage device continues to be idle as specified in one of the test steps.

20. A data storage device manufacture method according to claim 15, wherein:
said operation test is composed of plural test steps;
a plurality of said testers are connected with a host device, each said tester is connected with plural data storage devices and, each time one of the test steps is completed by one data storage device, the execution result is sent from said tester to the host device;
said waiting period is a period between the moment when a test step is completed by a data storage device connected to a tester and the moment when communication becomes possible to send the execution result of the test step to the host device from the tester; and
during said waiting period, the operation test of another data storage device, which is connected to the tester and has not completed the test step, is executed.

21. A data storage device manufacture method according to claim 15,
wherein said data storage device is a hard disk drive; the hard disk drive comprises a constructed hard disk assembly; and the hard disk assembly has a control board installed thereto; and
wherein the tester has adapters mounted thereon and the operation test is done by the tester whose adapter cards are connected via separate buses to the control cards which are installed to plural hard disk assemblies, respectively.

* * * * *